US009292007B2

(12) United States Patent
Henzler et al.

(10) Patent No.: US 9,292,007 B2
(45) Date of Patent: *Mar. 22, 2016

(54) BIPOLAR TIME-TO-DIGITAL CONVERTER

(71) Applicant: Intel Mobile Communications GmbH, Neubiberg (DE)

(72) Inventors: Stephan Henzler, Munich (DE); Markus Schimper, Moosinning (DE); Stefan Tertinek, Linz (AT)

(73) Assignee: Intel Deutschland GmbH, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/635,149

(22) Filed: Mar. 2, 2015

(65) Prior Publication Data
US 2015/0241850 A1 Aug. 27, 2015

Related U.S. Application Data

(63) Continuation of application No. 13/843,763, filed on Mar. 15, 2013, now Pat. No. 8,970,420.

(51) Int. Cl.
*H03M 1/10* (2006.01)
*G04F 10/00* (2006.01)
*H03M 1/50* (2006.01)

(52) U.S. Cl.
CPC ............... *G04F 10/005* (2013.01); *H03M 1/50* (2013.01)

(58) Field of Classification Search
CPC ....... G04F 10/00; G04F 10/04; G04F 10/005; G09B 23/288; H03M 1/50; H03K 19/0008; H03F 3/217
USPC .............. 341/120, 141, 155, 157, 166; 330/2; 324/76.11, 76.82; 375/371; 368/118, 368/120; 327/24, 26, 35, 276, 284
See application file for complete search history.

(56) References Cited

U.S. PATENT DOCUMENTS

| 7,804,290 B2* | 9/2010 | Henzler | G04F 10/00 324/76.11 |
| 8,064,561 B2* | 11/2011 | Henzler | G01R 31/31709 375/371 |
| 8,072,361 B2* | 12/2011 | Henzler | H03M 1/10 341/120 |
| 8,174,426 B2* | 5/2012 | Henzler | G04F 10/005 341/155 |
| 8,228,763 B2* | 7/2012 | Henzler | G04F 10/04 327/276 |

(Continued)

FOREIGN PATENT DOCUMENTS

DE 102014103092 A1 9/2014

OTHER PUBLICATIONS

"U.S. Appl. No. 13/843,763, Non Final Office Action mailed Mar. 28, 2014", 7 pgs.

(Continued)

*Primary Examiner* — Lam T Mai
(74) *Attorney, Agent, or Firm* — Schwegman Lundberg & Woessner, P.A.

(57) ABSTRACT

Representative implementations of devices and techniques provide bipolar time-to-digital conversion. For example, either a positive time duration or a negative time duration may be converted to a digital representation by a linear time-to-digital converter (TDC). A set of logic functions may be applied to the input of the TDC to provide start and/or stop signals for the TDC. Further, a correction component may be applied to an input or an output of the TDC to compensate for a delay offset of the TDC.

20 Claims, 14 Drawing Sheets

(56) References Cited

U.S. PATENT DOCUMENTS

| | | | | |
|---|---|---|---|---|
| 8,629,694 B1* | 1/2014 | Wang | G04F 10/005 |
| | | | 327/24 |
| 8,970,420 B2 | 3/2015 | Henzler et al. | |
| 8,970,763 B2* | 3/2015 | Shirakawa | G01C 17/00 |
| | | | 348/222.1 |
| 2013/0176158 A1* | 7/2013 | Kim et al. | 341/166 |
| 2013/0179158 A1* | 7/2013 | Nakamura | G10L 21/00 |
| | | | 704/205 |
| 2014/0266848 A1 | 9/2014 | Henzler et al. | |

OTHER PUBLICATIONS

"U.S. Appl. No. 13/843,763, Notice of Allowance mailed Oct. 17, 2014", 10 pgs.

"U.S. Appl. No. 13/843,763, PTO Response to Rule 312 Communication mailed Jan. 29, 2015", 2 pgs.

"U.S. Appl. No. 13/843,763, Response filed Sep. 29, 2014 to Non-Final Office Action dated Mar. 28, 2014", 8 pgs.

* cited by examiner a)

b)

a)                                                    b)

c)

BIPOLAR TIME-TO-DIGITAL CONVERTER

This application is a continuation of U.S. patent application Ser. No. 13/843,763, filed Mar. 15, 2013, now issued as U.S. Pat. No. 8,970,420, which is incorporated herein by reference in its entirety.

BACKGROUND

The trend of digitizing analog functionality often leads to time domain signal processing. In all-digital phase locked loops (PLL) for instance, the phase is quantized by means of time interval measurement. In a linear time-to-digital converter (TDC), the conversion of a time interval into a digital code may be started by one input signal and stopped by the other input signal. As this generally means that the start signal precedes the stop signal, a linear TDC (e.g., 102 at FIG. 1) is arranged to measure positive time intervals (e.g., asymmetrically). In a delay line-based TDC, for example, the start signal is fed into a delay line and propagates through delay elements, while the stop signal triggers the components that sample the state of the delay elements, ensuring that the start signal arrives before the stop signal. An example asymmetric output of a linear TDC is shown in FIG. 1 at diagram a).

Asymmetry has disadvantages, for example when a linear TDC 102 may be used in a feedback system where the average time interval to be measured is zero, and the TDC 102 needs to measure both positive and negative time values. For example, a measurement of bipolar time intervals, such as shown in FIG. 1 at diagram b) may be desired.

Signed or bipolar time interval measurement means that either of the two signal edges which define the time interval to be measured can lead. In conventional TDCs 102, however, the temporal sequence of the start and the stop signal may be well defined and fixed. This means that one signal starts the measurement and the other one stops the measurement. In the PLL application, a bipolar time interval measurement is desirable since the divided local oscillator (LO) signal edge, for example, can either lead or lag the reference signal.

To use a linear TDC 102 in a DPLL, for example, one solution is to delay the feedback signal with respect to the reference signal by a constant time offset, thereby guaranteeing that only positive phase-error values need to be measured. However, operating a DPLL with a positive offset results in increased TDC noise and power consumption.

Other solutions include forming some variation of a bipolar TDC arrangement, capable of measuring positive and negative time intervals, as shown in FIGS. 1 and 2, for example. For instance, one solution includes an approach, as illustrated in FIG. 1, where a positive offset ("delay") 104 is added to the signed time interval. In one case, the offset is larger than the maximum of the absolute negative value. Thus the time interval is always positive and a conventional TDC 102 can be used. One drawback is that the measurement time is prolonged by the offset. As noise accumulates during the measurement and scales with the number of delay elements in a square root manner, a larger measurement time results in more phase noise, and thus reduced effective resolution. Moreover, a longer measurement time means longer conversion time and thus higher power consumption.

Another solution includes using an edge selector 202 with the linear TDC 102 to determine the sign of the time interval to be measured, as shown in FIG. 2A, for example. A further solution includes using a pair of TDCs 204, one forward and one reverse, with each having half the length of a single linear TDC 102, as shown in FIG. 2B, for example. In the case of the pair of TDCs 204, the first TDC 204 measures the time interval between a first and a second input signal while the second TDC 204 measures the time interval between the second and the first input signal. The digital results of the two TDCs 204 may be subtracted in the digital domain to form the bipolar result. Compared to the previous approach the measurement time may be reduced which results in reduced phase noise. However, the use of two TDCs 204 results in an increase (e.g., by a factor of two) in area and power consumption. Another drawback includes strong matching requirements between the two TDCs 204.

One common problem in the implementation of a linear TDC 102 is the presence of an unknown delay offset (t_off in FIG. 3). Such an offset may be caused by imperfections in the analog implementation and by different propagation delays in the signal paths. Further, the delay offset may be highly susceptible to process, voltage, and temperature variations. Because of the delay offset, a positive digital output may be generated even though the STOP signal may be leading the START signal (negative time interval) as seen in FIG. 3 at diagrams a) and b). This results in a shift of the TDC characteristic by t_off as seen in FIG. 3 at diagram b).

One significant problem is that the unknown delay offset may cause the TDC 102 characteristic to be nonlinear, even though the linear TDC 102 itself has a linear characteristic (FIG. 3 at diagram c)). A TDC 102 with a nonlinear characteristic is disadvantageous in many applications, particularly in feedback systems where a nonlinear element inside the loop may cause instability or degrade the system performance.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 1 also includes a block diagram of an example time-to-digital converter (TDC) circuit, such as the techniques and devices disclosed herein may be applied. The example TDC of FIG. 1 includes a delay element to form measurements of bipolar time intervals, which may not be included in various implementations.

DETAILED DESCRIPTION

Overview

Representative implementations of devices and techniques provide bipolar time-to-digital conversion with a single conventional linear time-to-digital converter (TDC). For example, either a positive time duration or a negative time duration may be converted to a digital representation by a linear TDC. In various implementations, a set of logic functions may be applied to the input of the TDC to provide start and/or stop signals for the TDC. In other implementations, various components may be used to provide polarity information.

Additionally, in various implementations, a correction component may be applied to an input or an output of the TDC to compensate for a delay offset of the TDC. For example, the correction component may be calibrated using a calibration algorithm. In one example, the correction component is tuned using one or more calibration signals.

Various implementations and techniques for TDC circuit arrangements are discussed in this disclosure. Techniques and devices are discussed with reference to example conventional linear TDC devices and systems illustrated in the figures. However, this is not intended to be limiting, and is for ease of discussion and illustrative convenience. The techniques and devices discussed may be applied to various TDC circuit designs, structures, devices, and the like, and remain within the scope of the disclosure.

Implementations are explained in more detail below using a plurality of examples. Although various implementations and examples are discussed here and below, further implementations and examples may be possible by combining the features and elements of individual implementations and examples.

Example Bipolar Time-to-Digital Converter Arrangement

Figure 4:
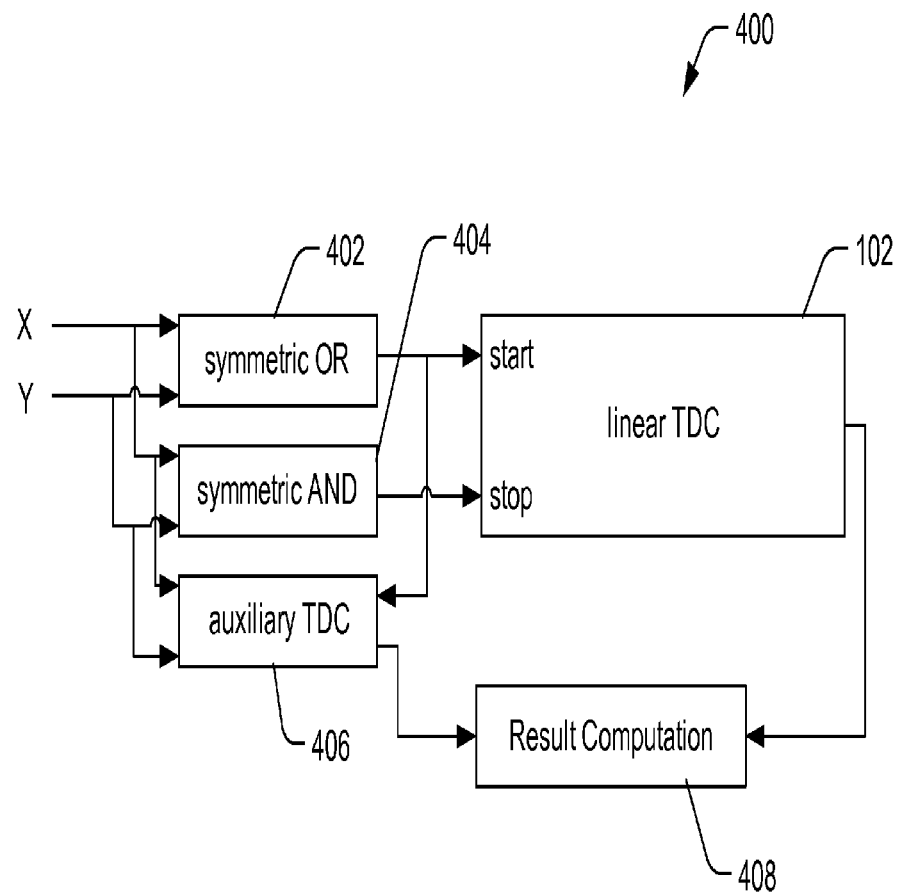
FIG. 4 is a block diagram of an example bipolar TDC circuit, including logic functions applied at the inputs, according to an implementation.

Referring to FIGS. 4-7, an example bipolar time-to-digital converter arrangement is disclosed. FIG. 4 is a block diagram of an example bipolar TDC arrangement ("BTDC") 400, including logic functions applied at the inputs, according to an implementation. Analog input signals or triggers ("inputs") such as x and y (in no particular order), for example, represent a beginning point and an ending point of a time interval. The inputs are received on the input side of the BTDC 400, processed by a quantity of components, and digital results ("digital output," "digital approximation," "digital value," or "digital representation") are output from the BTDC 400. In an implementation, the digital results represent a duration of the time interval and a polarity or sign (i.e., positive or negative) of the time interval.

For the purposes of this disclosure, a digital result may be described as a digital approximation of an analog input. For example, a digital result may include a digital representation that is proportional to the duration of the time interval, or the like, and include digital information regarding the sign of the time interval. The digital representation may be expressed in various ways (e.g., base 2 binary code, binary coded decimal, voltage values, electrical or light pulse attributes, and the like).

As shown in FIG. 4, in one implementation, a BTDC 400 may include a conventional linear TDC (such as a TDC 102, for example) arranged to output a duration value based on receiving a start signal and a stop signal. In an implementation, the BTDC 400 is arranged to output a digital value representative of the duration of a time interval and the polarity of the time interval, based on the duration value. In the implementation, the time interval comprises a positive time interval or a negative time interval.

In an implementation, the BTDC 400 also includes a symmetric OR gate 402 arranged to output the start signal based on receiving a first input and a second input (x and y). For example, the first input x may be representative of a beginning point or an ending point of the time interval and the second input y may be representative of the other of the beginning point or the ending point of the time interval.

In the implementation, the BTDC 400 also includes a symmetric AND gate 404 arranged to output the stop signal based on receiving the first input and the second input (x and y). In one example, the OR gate 402 and/or the AND gate 404 includes a symmetric delay at each of the inputs (e.g., x and y), providing an equal delay from each of the inputs (e.g., x and y) through the respective gate and to the output of the OR gate 402 and/or the AND gate 404.

Figure 1:
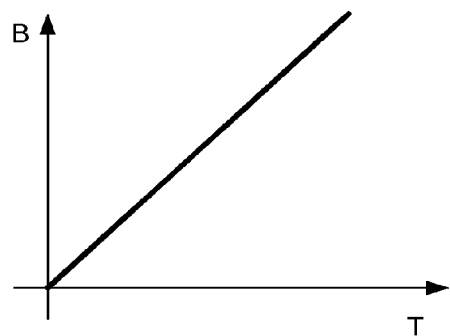
FIG. 1 illustrates a pair of output curves for a time-to-digital converter (TDC) circuit, including an asymmetric output and a bipolar output.
Figure 1:
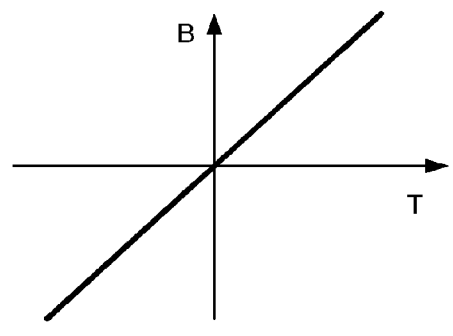
Figure 1:
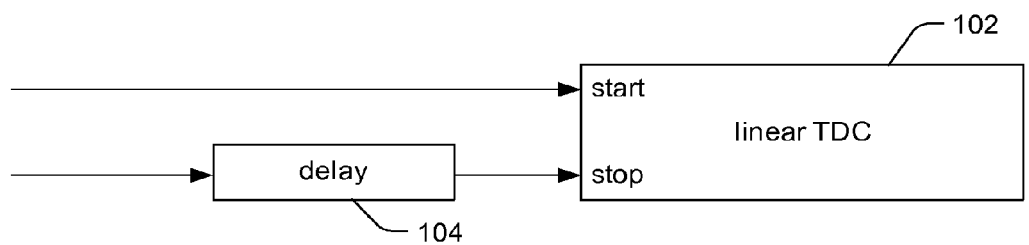
Figure 2A:
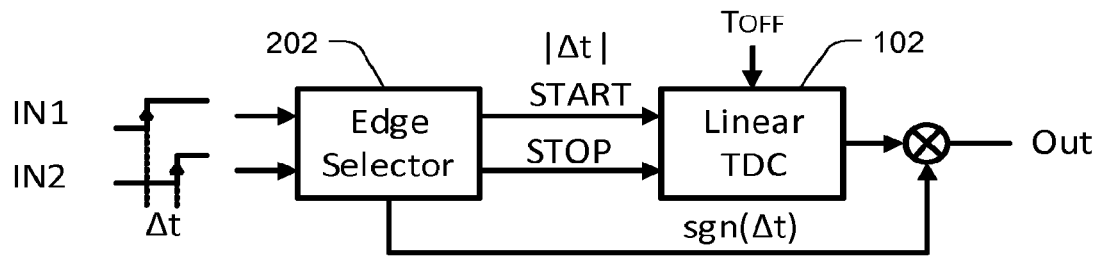
FIG. 2A is a block diagram of an example bipolar TDC circuit solution.
Figure 2B:
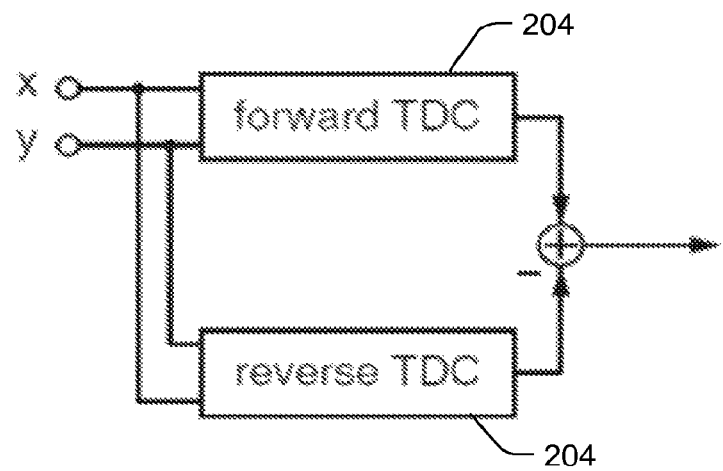
FIG. 2B is a block diagram of another example bipolar TDC circuit solution.
Figure 3:
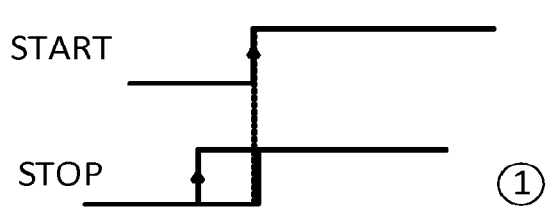
FIG. 3 shows graphical diagrams of example outputs of a TDC circuit having a delay offset.
Figure 3:
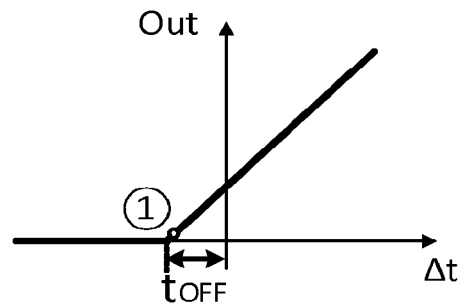
Figure 3:
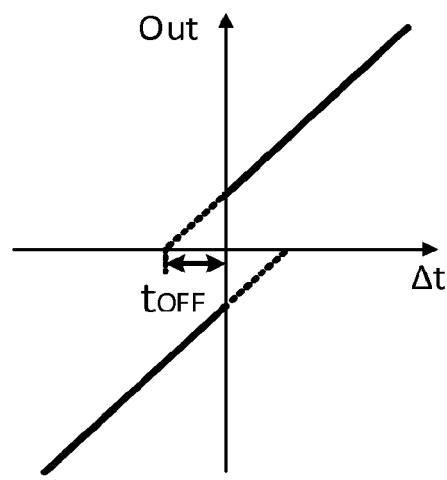

In an implementation, as shown in FIG. 4, a single (conventional) TDC 102 is used for measurement of both positive and negative time intervals (see FIG. 1b)). The TDC 102 inputs "start" and "stop" which are asymmetric by definition, are coupled to the two bipolar inputs x and y in a symmetric way. In an implementation, the logic OR gate 402 includes a symmetric delay from each input, and generates the internal start signal. Thus any signal x or y can start the measurement. The symmetric AND gate 404 generates the internal stop signal. This means that the signal (input x or y) which occurs first starts the measurement and the other one (x or y) stops the measurement. The signal generation arrangement described has the advantage of avoiding synchronous elements (e.g., latches, flip-flops, etc.). This is advantageous because synchronous elements can contribute to higher latency and are often at risk of metastability, which may lead to a non-linear BTDC 400 characteristic.

In an implementation, as shown in FIG. 4, the BTDC 400 includes an auxiliary TDC 406 coupled in parallel to the OR gate and the AND gate. In the implementation, the auxiliary TDC 406 is arranged to determine the polarity of the time interval. In one example, the auxiliary TDC 406 is also coupled to the start signal and is arranged to detect whether the first input or the second input is representative of the beginning point of the time interval. For instance, in the example, the auxiliary TDC 406 is arranged to detect which signal (x or y) has started the measurement. In that way, the auxiliary TDC 406 can detect the sign of the time interval measurement.

In one implementation, the absolute duration value provided by the TDC 102 and the sign information provided by the auxiliary TDC 406 are combined in a digital post processing component ("result computation") 408. In the implementation, the post-processing component 408 is arranged to receive the duration value (from the TDC 102 or the auxiliary TDC 406, for example) and the polarity of the time interval (from the auxiliary TDC 406, for example) and to output the digital value of the measured time interval. In one case, the digital post processing component 408 adds the sign bit to the absolute duration value.

In a further implementation, the post processing component 408 may also add some calibration information to the result. For example, the post processing component 408 may add calibration information to the digital value based on an overlap of duration value outputs from the TDC 102 and the auxiliary TDC 406.

In an alternate implementation, a multiplicity of "N" event (e.g., input) signals may exist to determine a measureable time interval. In the implementation, the BTDC 400 measures the time interval between the occurrences of the very first event till all event signals are active. For example, in one implementation, the OR gate 402 is arranged to output the start signal based on receiving a multiplicity of three or more inputs and the AND gate 404 is arranged to output the stop signal based on receiving the multiplicity of three or more inputs. In the example, the OR gate 402 is arranged to output the start signal when a first input of the multiplicity of three or more inputs is active and the AND gate 404 is arranged to output the stop signal when all inputs of the multiplicity of three or more inputs are active.

In various implementations, an example BTDC 400 may include additional components or alternate components to perform the functions discussed, or for other desired functionality.

Example Implementations

Figure 5:
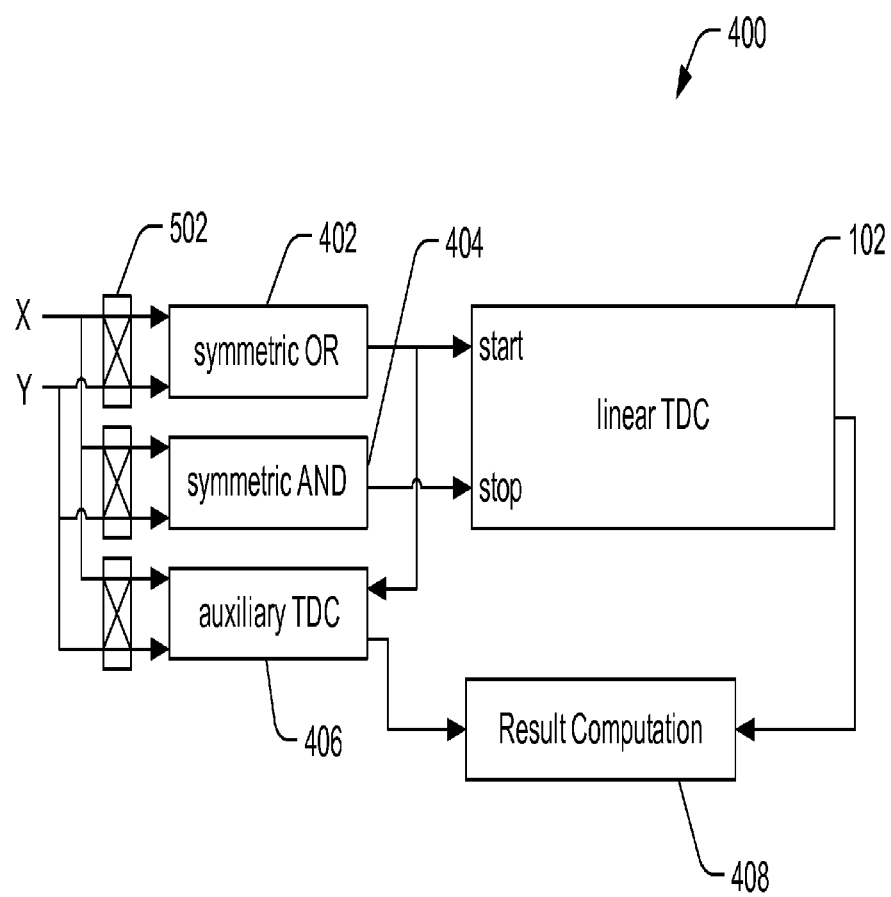
FIG. 5 is a block diagram of the example bipolar TDC circuit of FIG. 4, including chopped inputs, according to another implementation.

In various implementations, alternate components and/or techniques may be applied with a BTDC 400 to achieve desired results. In one implementation, as shown in FIG. 5, the inputs to the OR gate 402, the AND gate 404, and/or the auxiliary TDC 406 may be "chopped," to minimize the impact of any remaining asymmetry in the inputs x and y and/or the gates 402, 404 and the aux TDC 406. For example, the inputs x and y may be routed through one or more input chopper components 502 prior to being received by the OR gate 402, the AND gate 404, and/or the auxiliary TDC 406.

Figure 6A:
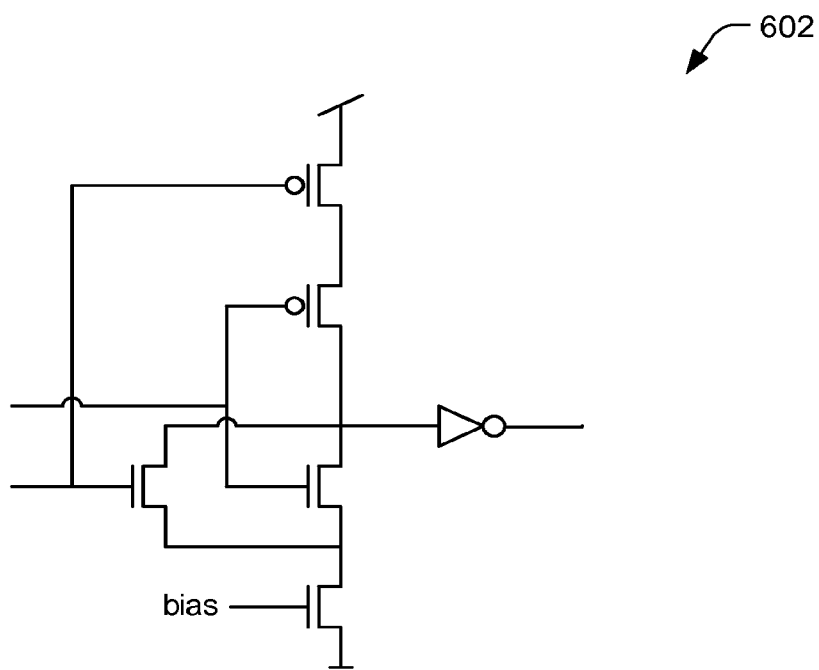
FIG. 6A is a schematic diagram of an example symmetric OR gate circuit, according to an implementation.
Figure 6B:
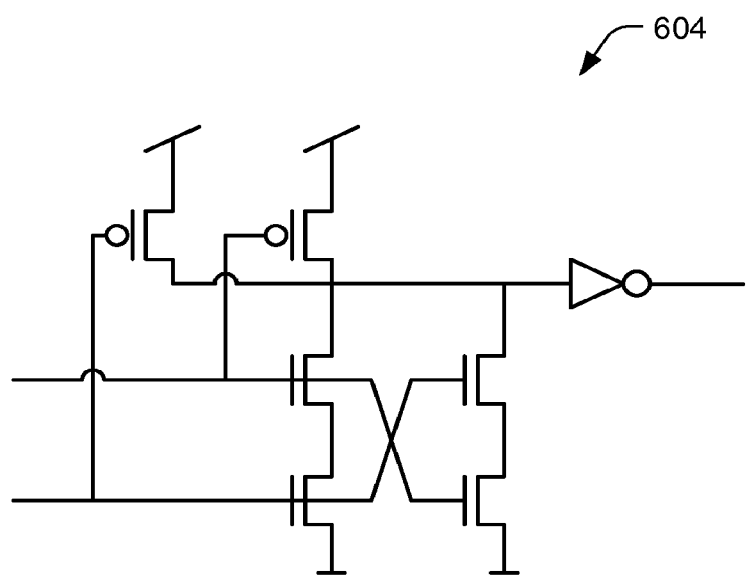
FIG. 6B is a schematic diagram of an example symmetric AND gate circuit, according to an implementation.

FIGS. 6A and 6B illustrate example circuit implementations 602 and 604 of the OR gate 402 and the AND gate 404 components, respectively. For example, as shown in FIGS. 6A and 6B, the OR gate 402 and/or the AND gate 404 may be implemented as "charged starved" components. In various implementations, the OR gate 402 and/or the AND gate 404 may be implemented as such to limit and/or control charge or discharge current within the component 402, 404. While the circuits 602 and 604 are shown implemented with CMOS technology, various other technologies, designs, structures, and the like, may be used to implement the OR gate 402 and/or the AND gate 404.

In an alternate implementation, the auxiliary TDC 406 is arranged to output the duration value for a preselected range of time intervals. For example, the auxiliary TDC 406 may be arranged to measure very small time intervals (e.g., few nanoseconds to tens of nanoseconds, etc.). In such an implementation, the auxiliary TDC 406 can be used not only to detect the sign of the digital result but also to measure the very small time intervals.

Figure 7:
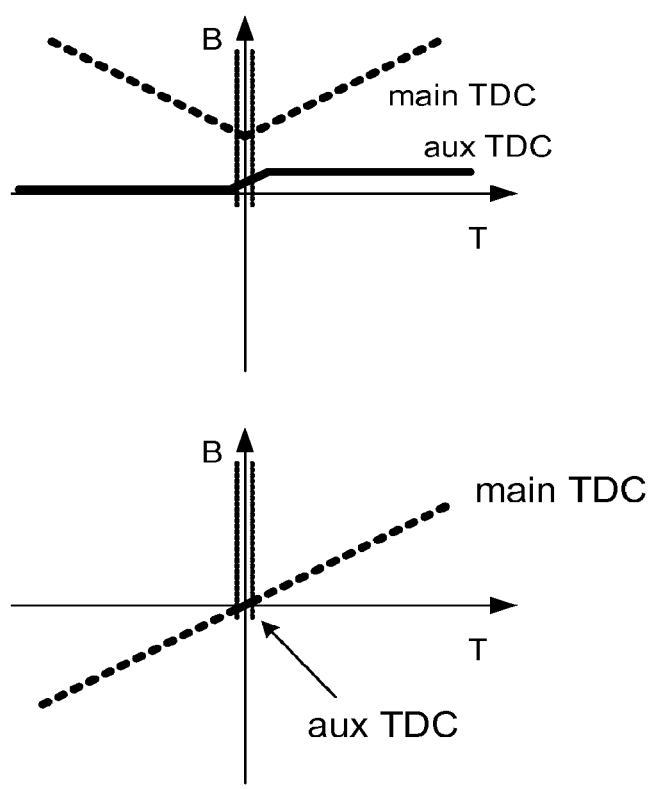
FIG. 7 is a graphical diagram of an example output of the TDC circuit of FIG. 3, including an auxiliary TDC, according to an implementation.

Example output curves are shown in FIG. 7. In the graphs, the solid line represents time intervals measured by the auxiliary TDC 406 and the dashed line represents time intervals measured by the TDC 102. As shown in the graphs of FIG. 7, in one implementation, the auxiliary TDC 406 is responsible for very small time intervals around zero and the main TDC 102 is arranged to measure larger time intervals. In various implementations, the assigned time intervals may be predetermined, user-selectable, programmable, and the like. In other implementations, the auxiliary TDC 406 and the TDC 102 overlap in their assigned measurement of time intervals.

Figure 8:
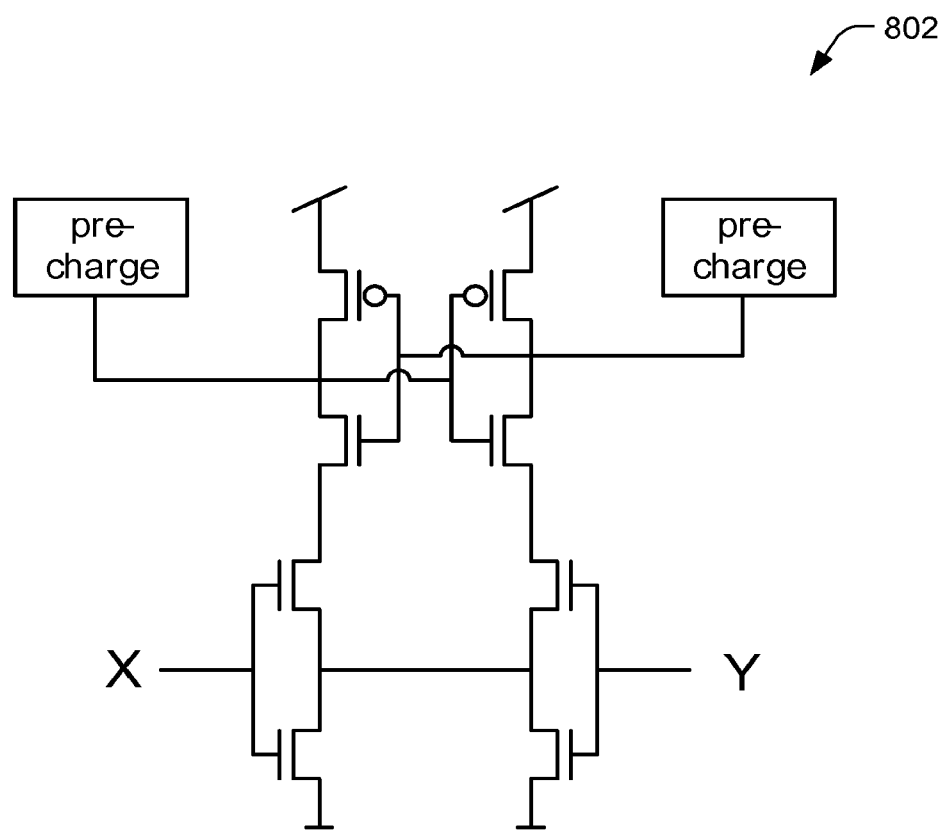
FIG. 8 is a schematic diagram of an example auxiliary TDC circuit, according to an implementation.

In an implementation, as shown in FIG. 8, the auxiliary TDC 406 can be implemented as either a single arbiter, for example, or a single comparator, if only the sign (e.g., polarity) of the measurement is of interest. For example, the auxiliary TDC 406 may be implemented as the arbiter circuit 802 of FIG. 8, if the auxiliary TDC 406 will be providing sign information to the BTDC 400 and not duration information.

Alternately, if the auxiliary TDC 406 is arranged not only for sign detection but also to measure a small time interval region around zero, the auxiliary TDC 406 may be implemented as a small conventional TDC, with e.g. 3-4 bit resolution and may have some latency in the stop path. In other implementations, the auxiliary TDC 406 may be implemented with other circuit designs, types, and the like to provide the desired features.

Figure 9:
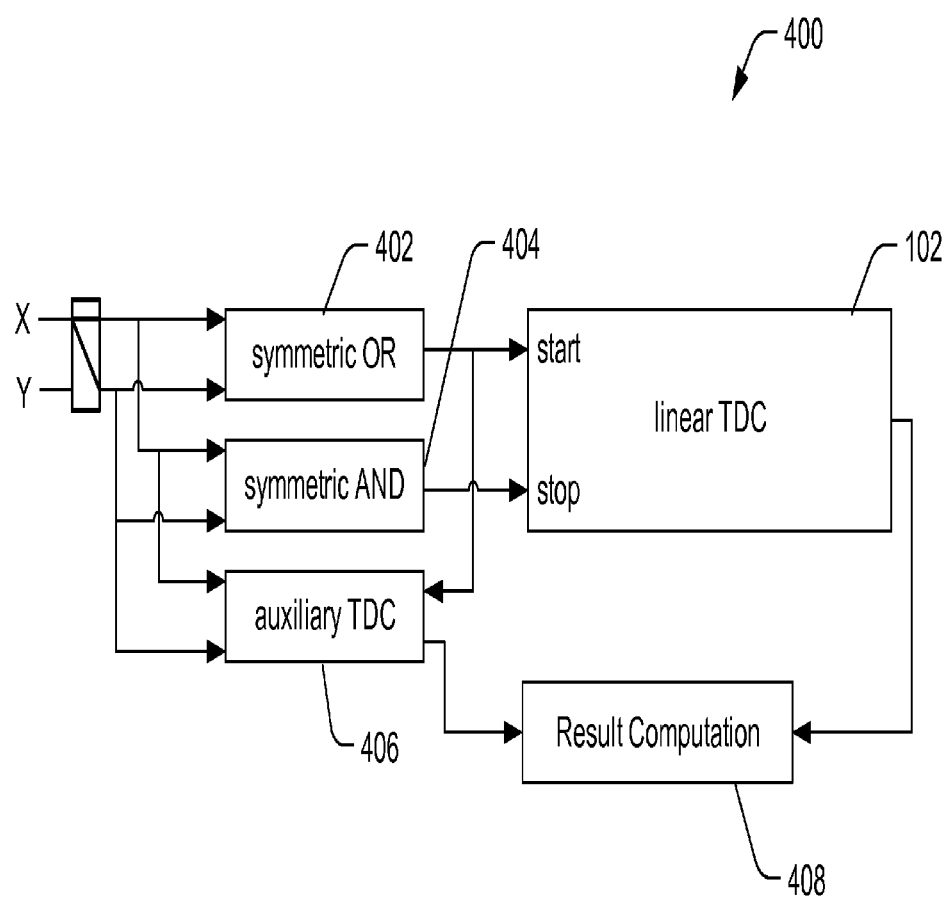
FIG. 9 is a block diagram of the example bipolar TDC circuit of FIG. 3, including foreground calibration functionality, according to an implementation.

In an implementation, due to the overlapping of the measurement ranges (by the TDC 102 and the auxiliary TDC 406, see FIG. 7) a calibration of the TDC 102 may be arranged either in the foreground or in the background. Referring to FIG. 9, an implementation of an example BTDC 400 is shown arranged for foreground calibration of the TDC 102 offset and sign trip point. In the implementation, both inputs x and y are fed with the same signal to generate a zero time interval. For example, the offset of the overall time measurement device (TDC 102) can be measured in the foreground by shorting the two (or more) inputs x and y, and determining an error (e.g., some value other than zero) at the output of the TDC 102.

In another example, background calibration can be performed by detecting the minimum absolute value and/or the signal statistics. For example, the calibration can be determined by continuously tracking the minimum absolute value of the main TDC 102 output to see if it converges on an error value.

In alternate implementations, additional or alternate BTDC 400 arrangements may be used to provide desired results, as described above.

Example Calibration Arrangement

Figure 10:
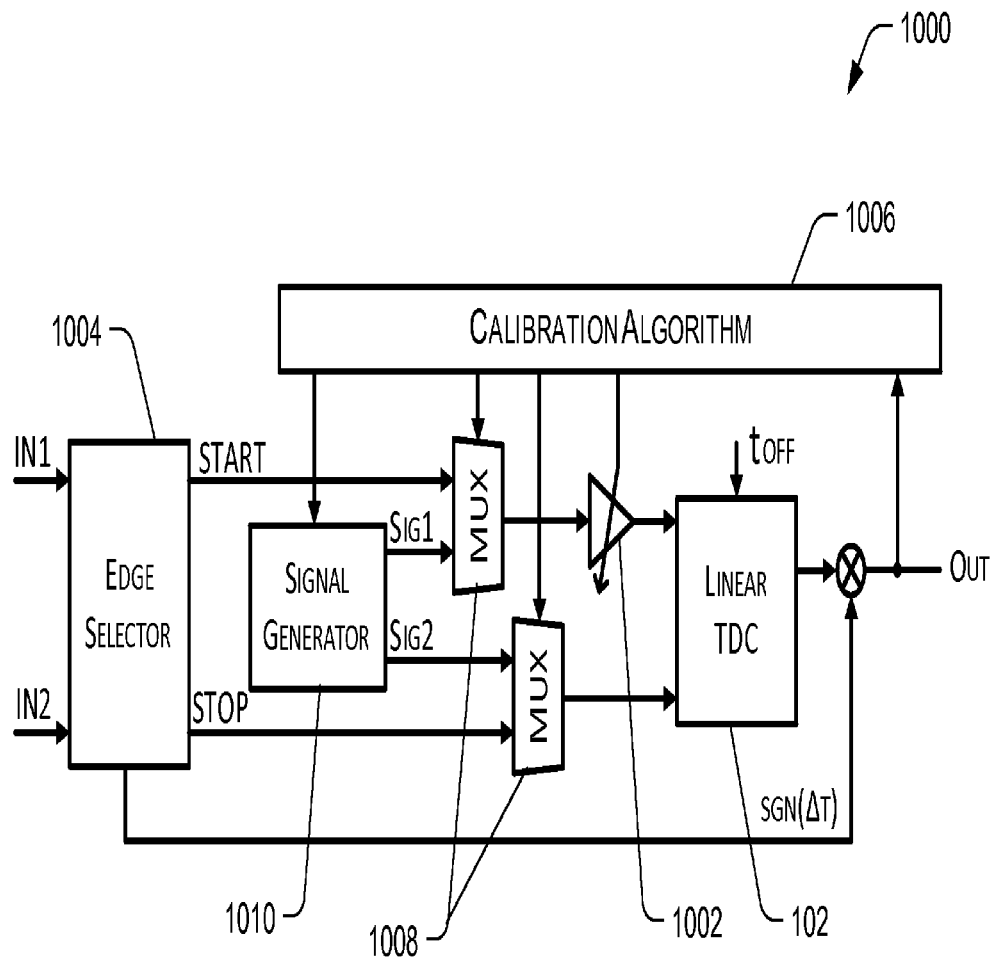
FIG. 10 is a block diagram of an example bipolar TDC circuit, including delay offset calibration functionality in an analog domain, according to an implementation.

Referring to FIG. 10, in various implementations, a correction element 1002 is arranged to calibrate the delay offset of the BTDC 1000 in the analog domain and/or in the digital domain. In the implementations, an adjustable correction component 1002 is arranged to modify the start signal (analog domain) and/or the duration value (digital domain) of the TDC 102, based on a delay offset (e.g., t_off) of the TDC 102.

In one implementation, the delay offset is determined by processing one or more calibration signals (sig1, sig2) through the TDC 102.

As shown in FIG. 10, a linear time-to-digital converter (TDC) 102 is arranged to output a duration value based on receiving a start signal and a stop signal. In the example shown in FIG. 10, the BTDC 1000 is arranged to output a digital value representative of a duration of a time interval and a polarity of the time interval based on the duration value, where the time interval comprises a positive time interval or a negative time interval. The BTDC 1000 circuit of FIG. 10 is an example bipolar time-to-digital converter, for discussion purposes, and is not intended to be limiting. The correction component 1002 may be applied to various designs, types, structures, and the like, of BTDCs, and remain within the scope of the disclosure. For example, in an implementation, the BTDC 1000 comprises the BTDC 400, or the like.

In an implementation, as shown in FIG. 10, the BTDC 1000 includes an input component 1004 arranged to output the start signal and the stop signal based on receiving a first input and a second input (IN1 and IN2; x and y; etc.). In the implementation, the first input is representative of one of a beginning point or an ending point of the time interval and the second input is representative of the other of the beginning point or the ending point of the time interval.

In one implementation, for example, the input component 1004 comprises a symmetric OR gate 402 arranged to output the start signal based on receiving the first input and the second input, and a symmetric AND gate 404 arranged to output the stop signal based on receiving the first input and the second input, as discussed above.

In various implementations, calibration of the BTDC 1000 using the correction component 1002 may include applying one or more calibration signals (sig1, sig2) to the BTDC 1000. For example, the calibration signals (sig1, sig2) may be applied during a calibration mode of the BTDC 1000, instead of the normal start and stop signals used during an operational mode. The calibration signals (sig1, sig2) are processed by the TDC 102, resulting in a detected delay offset t_off.

In various implementations, the calibration signals (sig1, sig2) may be generated by a signal generator 1010, or the like, or may be derived from signals in use in the BTDC 1000 circuit, or the circuit or system in which the BTDC 1000 operates.

In an implementation, the delay offset t_off may be determined using a calibration algorithm 1006. For example the calibration algorithm 1006 may determine the deviation between the actual output of the TDC 102 and an expected output of the TDC 102, based on the calibration signals (sig1, sig2). In alternate implementations, other signals of the BTDC 1000 may be processed by the calibration algorithm 1006 as well.

In an implementation, the calibration algorithm 1006 is arranged to tune the correction component 1002 based on the delay offset t_off determined by processing the one or more calibration signals (sig1, sig2) through the TDC 102. In the implementation, the correction component 1002 may be adjusted by the calibration algorithm, to compensate for the delay offset t_off of the TDC 102. When the start and stop signals, generated by the input component, are sent to the TDC 102 for processing, the correction component 1002 can adjust one or more of the start and stop signals, or other signals, to compensate for the delay offset t_off of the TDC 102. Thus, a corrected digital representation of the measured time interval represented by the start and stop signals is generated by the BTDC 1000.

In an implementation, the BTDC 1000 includes two or more multiplexers 1008 arranged to multiplex the start signal and the stop signal with the one or more calibration signals (sig1, sig2). For example, the outputs of the two or more multiplexers 1008 are the start and stop inputs to the TDC. In one implementation, as described, the two or more multiplexers 1008 are arranged to output the start signal and the stop signal while the BTDC 1000 (and/or TDC 102) is in an operational mode and are arranged to output the one or more calibration signals (sig1, sig2) while the BTDC 1000 is in a calibration mode.

Figure 11:
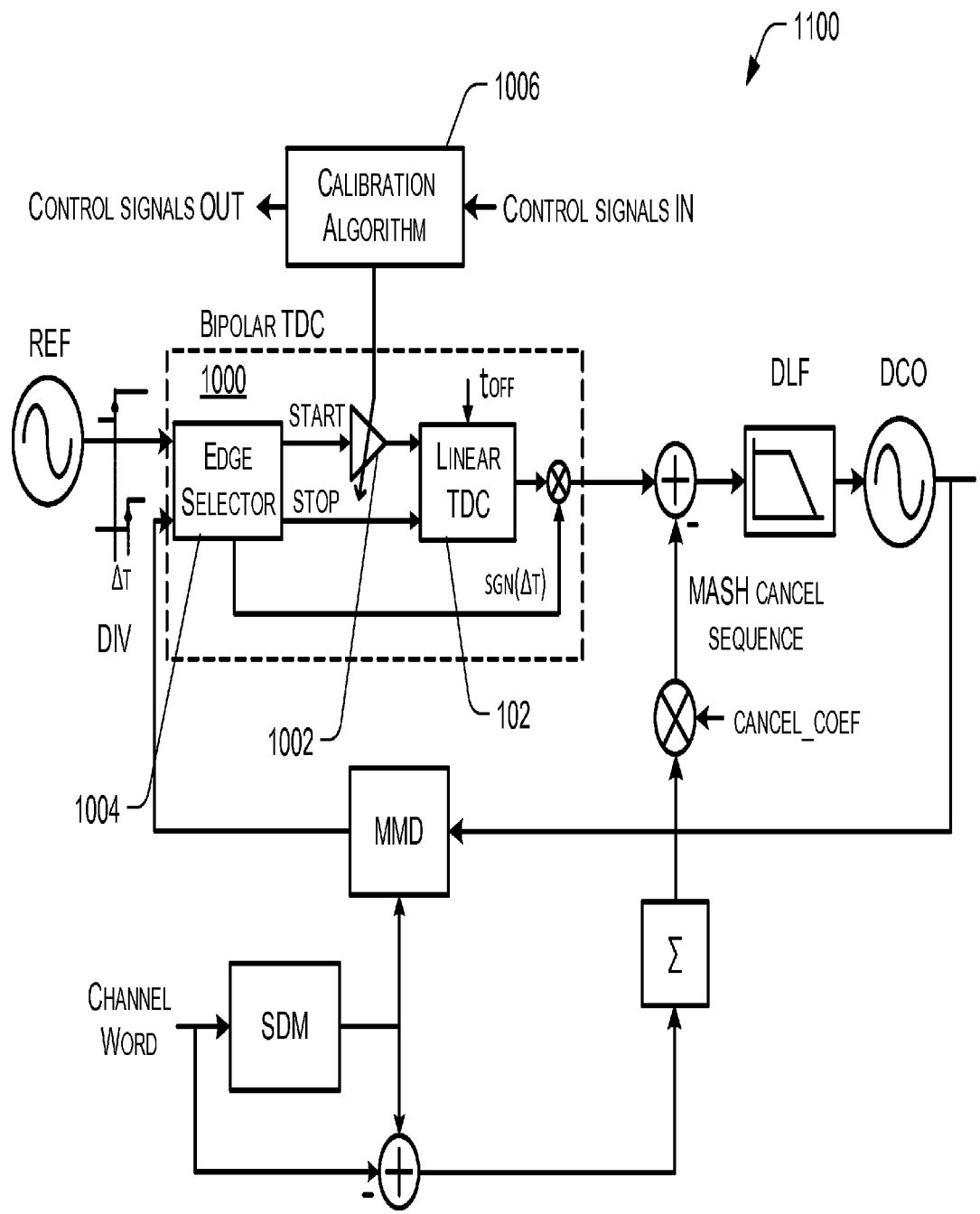
FIG. 11 is a block diagram of an example digital PLL incorporating the bipolar TDC circuit of FIG. 10, including delay offset calibration functionality in the analog domain, according to an implementation.

In one implementation, as shown in FIGS. 10 and 11, the correction component 1002 is applied to an analog portion of the BTDC 1000. In the implementation, the correction component 1002 is arranged to adjust the start signal to compensate for the delay offset t_off of the TDC 102. As shown in FIGS. 10 and 11, in the implementation, the BTDC 1000 includes the adjustable correction component 1002 arranged to modify the start signal of the TDC 102 as it is output from one of the multiplexers 1008, prior to the TDC 102. In the example, the delay offset t_off is determined by processing one or more calibration signals (sig1, sig2) through the TDC 102, and the determining may be performed iteratively or repeatedly. For example, the BTDC 1000 may continuously calibrate for delay offset values that may change with operating conditions, and the like.

FIG. 11 shows a block diagram of an example digital PLL 1100 incorporating the BTDC circuit 1000 of FIG. 10. In the example shown, the delay offset calibration functionality is performed in the analog domain, as shown in FIG. 10.

In the example shown in FIG. 11, the analog correction element 1002 (adjustable delay) is placed in the signal path before the linear TDC 102. In the example, no dedicated signal generator 1010 is needed for calibration; rather the reference (REF) and feedback (DIV) signals used during normal operation of the PLL 1100 serve as calibration signals.

Control signals from a calibration algorithm 1006 set loop-specific parameters (e.g., the channel word) to establish a pre-determined phase/frequency relationship between REF and DIV, for example. The BTDC 1000 output and/or control signals from the loop (e.g., the MASH cancel sequence) are fed into the calibration algorithm 1006, and used to retrieve information for adjustment of the delay element 1002.

In an exemplary calibration algorithm 1006, the DPLL 1100 produces a saw-tooth shaped phase error between REF and DIV by having the multi-modulus divider (MMD) connected to a first-order sigma-delta modulator (SDM). Due to the nonlinearity of the BTDC 1000, the saw-tooth shaped phase error will appear nonlinearly distorted at the TDC 102 output. By comparing the TDC 102 output with the MASH cancel sequence (undistorted saw-tooth signal), the calibration algorithm 1006 determines the amount of distortion and tunes the delay element 1002 until the distortion disappears, and thus the delay offset t_off is compensated. The simple saw-tooth shaped waveform allows the use of a least-mean-squares (LMS) adaptive algorithm, efficiently implemented as a sign-sign LMS, for example, to adaptively tune the delay element 1002.

As mentioned above, calibration of the DPLL 1100 can be done during a dedicated calibration time (e.g., before locking), or can be run in the background to allow tracking of changes in the delay offset t_off (e.g., due to a temperature drift, etc.).

Figure 12:
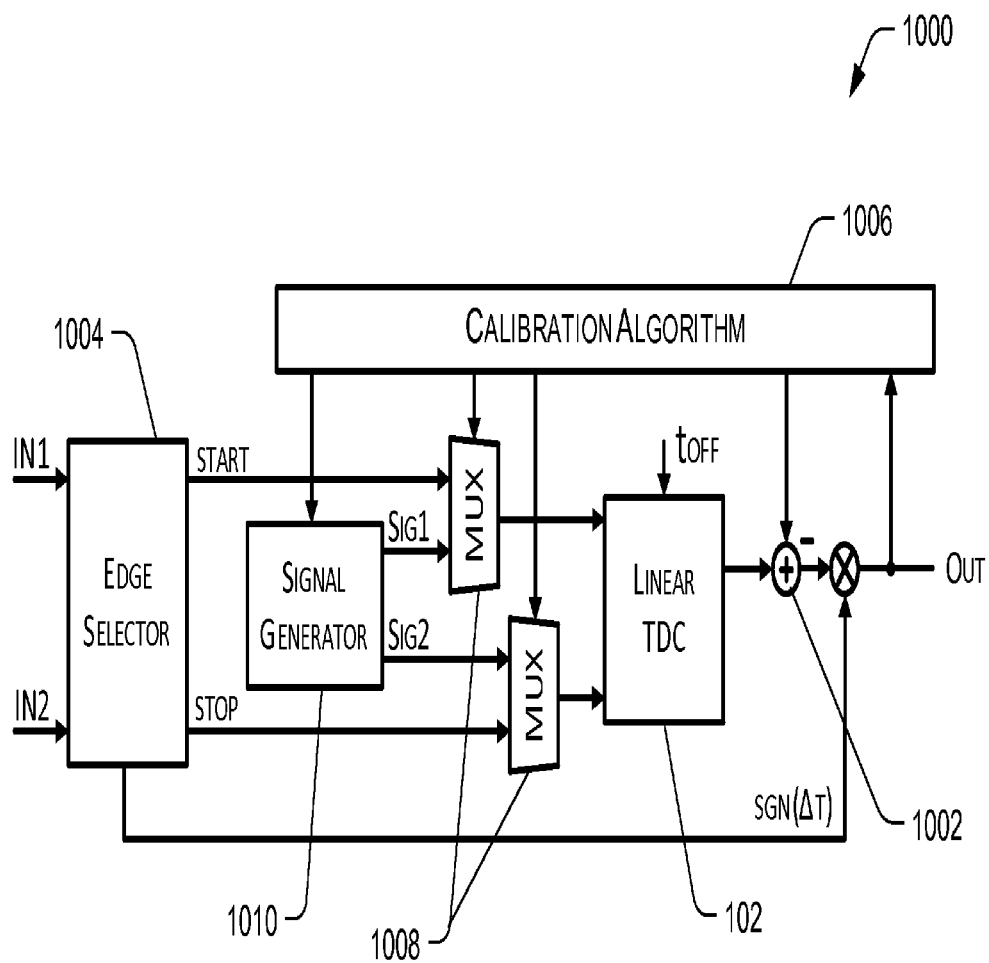
FIG. 12 is a block diagram of an example bipolar TDC circuit, including delay offset calibration functionality in a digital domain, according to an implementation.
Figure 13:
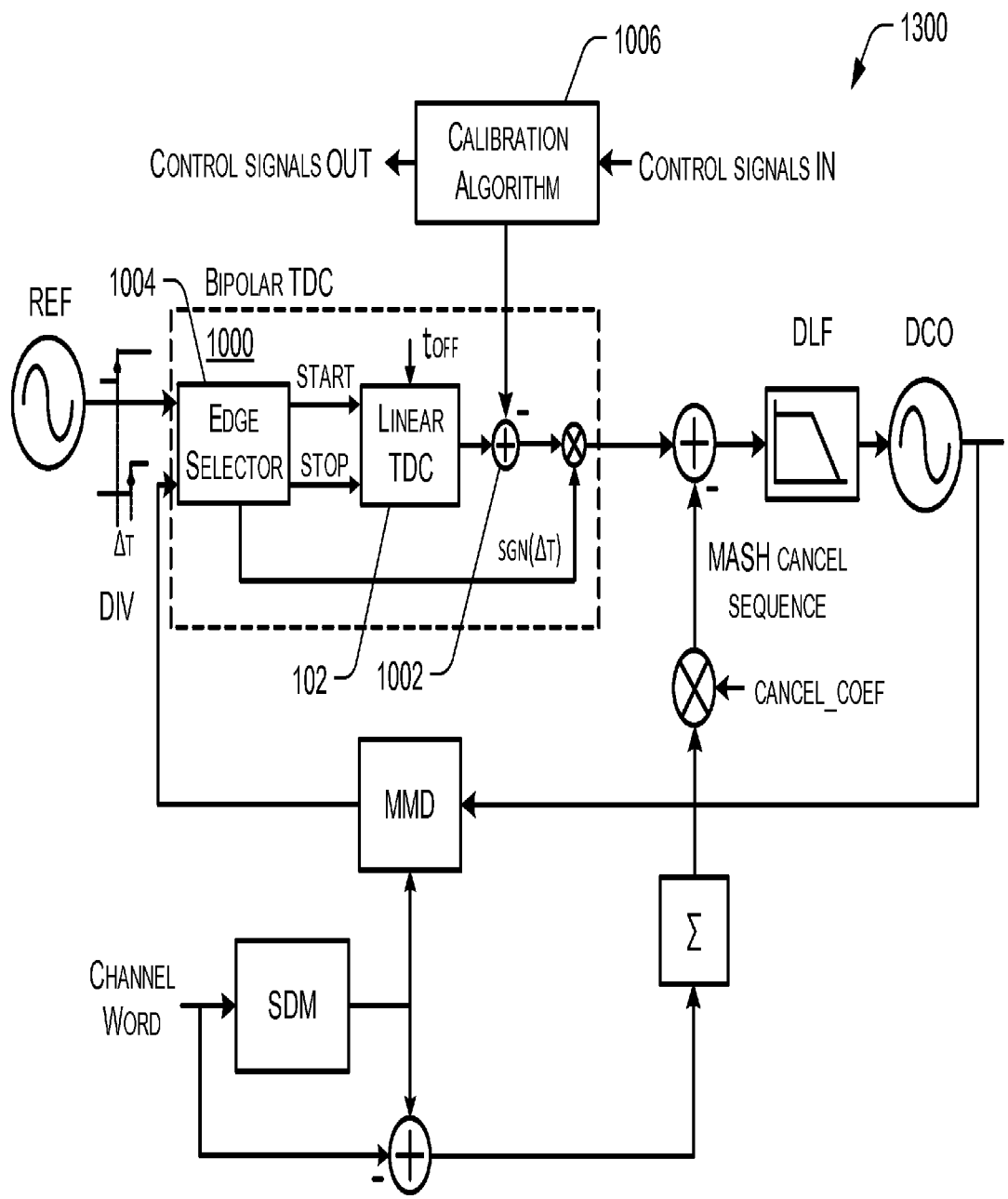
FIG. 13 is a block diagram of an example digital PLL incorporating the bipolar TDC circuit of FIG. 12, including delay offset calibration functionality in the digital domain, according to an implementation.

In one implementation, as shown in FIGS. 12 and 13, the correction component 1002 is applied to a digital portion of the BTDC 1000. In the implementation, the calibration of the BTDC 1000 uses a digital subtractor as a correction element 1002 in the digital domain. In an implementation, the calibrated digital code (digital offset) subtracted from the output of the linear TDC 102 compensates the delay offset t_off introduced by the linear TDC 102, thereby removing the nonlinearity of the TDC 102. In other words, the correction component 1002 is arranged to adjust the duration value output from the TDC 102 to compensate for the delay offset t_off of the TDC 102.

As shown in FIGS. 12 and 13, in one implementation, the BTDC 1000 includes the adjustable correction component 1002 arranged to modify the duration value output by the TDC 102. In the example of FIGS. 12 and 13, the delay offset t_off is determined by processing one or more calibration signals (sig1, sig2) through the TDC 102, and the determining may be performed iteratively or repeatedly. For example, the BTDC 1000 may continuously calibrate for delay offset values that may change with operating conditions, and the like.

FIG. 13 shows a block diagram of an example digital PLL 1300 incorporating the BTDC circuit 1000 of FIG. 12. In the example shown, the delay offset calibration functionality is performed in the digital domain, as shown in FIG. 12.

In the example shown in FIG. 13, the digital correction element 1002 (digital subtraction) is placed at the output of the linear TDC 102. Similar to the calibration techniques in the analog domain described above, the REF and DIV signals used during normal operation can serve as the calibration signals (sig1, sig2). The example LMS-based calibration algorithm 1006 can be employed to tune the digital offset that is subtracted from the TDC 102 output.

The exemplary calibration algorithm 1006 using a sawtooth shaped phase error described with reference to FIG. 11 is also applicable here, and in like circuits and systems. In example implementations, such as those described with reference to FIGS. 11 and 13, the calibration algorithm 1006 can be adjusted based on various control signals such as the BTDC 1000 output, and the MASH cancel sequence. Further, the calibration algorithm 1006 may output control signals such as a channel word, and the like.

As mentioned above, using the techniques described with reference to FIGS. 11 and 13, changes in the delay offset, such as those caused by a temperature drift, can be automatically tracked by running the calibration algorithm 1006 in the background; with no dedicated re-calibration slot needed.

As discussed above, the techniques, components, and devices described herein with respect to the implementations are not limited to the illustration of FIGS. 1-13, and may be applied to other BTDC devices and designs without departing from the scope of the disclosure. In some cases, additional or alternative components may be used to implement the techniques described herein. Further, the components may be arranged and/or combined in various combinations, while resulting in an increased negative resistance. It is to be understood that a BTDC circuit 400 or 1000 may be implemented as a stand-alone device or as part of another system (e.g., integrated with other components, systems, etc.). In various implementations, additional or alternative components may be used to accomplish the disclosed techniques and arrangements.

Representative Process

Figure 14:
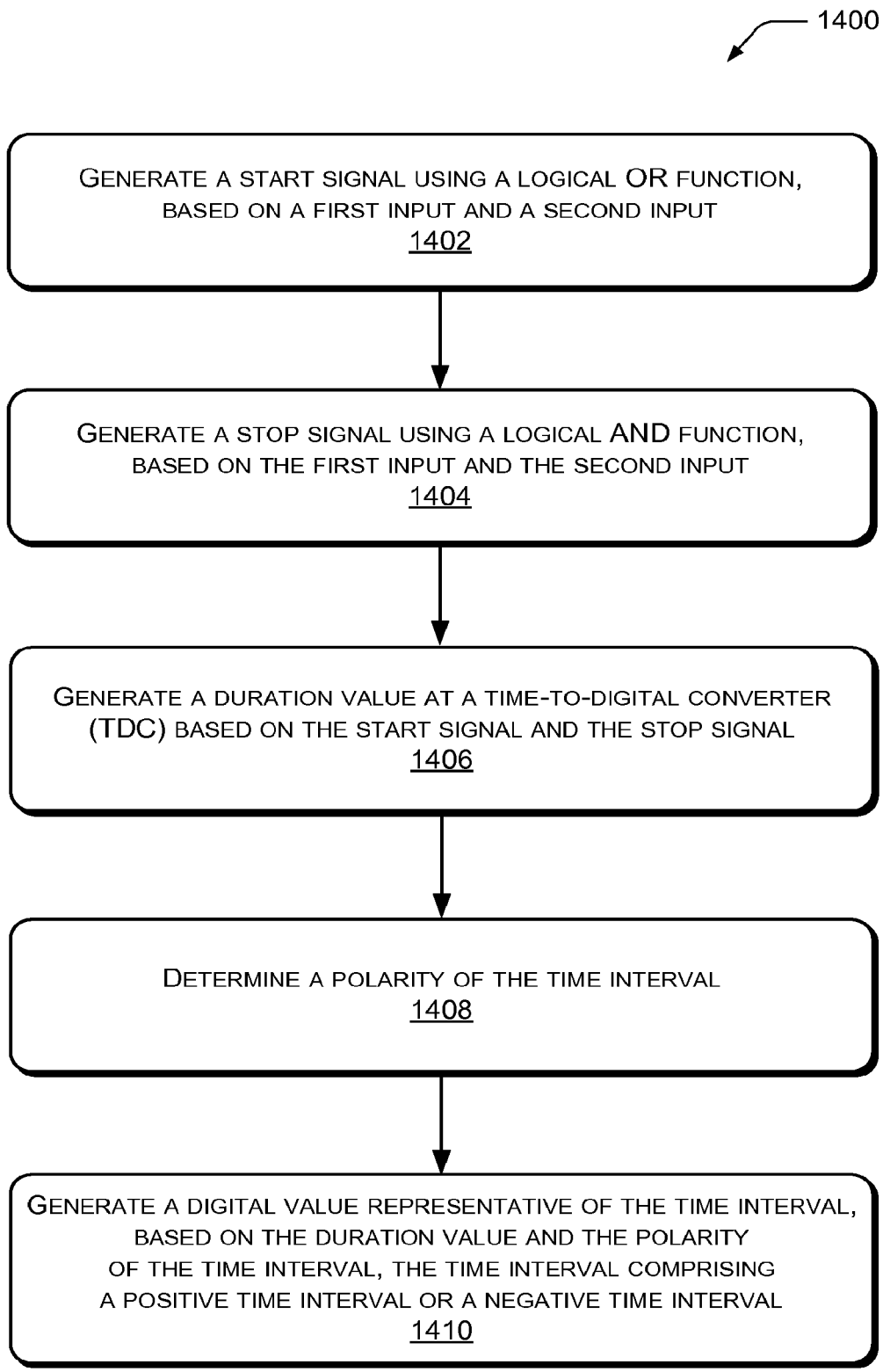
FIG. 14 is a flow diagram illustrating an example process for providing a bipolar digital representation for a time interval, according to an implementation.

FIG. 14 is a flow diagram illustrating an example process 1400 for providing a bipolar digital representation for a time interval, according to various implementations. The process 1400 is described with reference to FIGS. 1-13.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 1402, the process 1400 includes generating a start signal using a logical OR function (such as with an OR gate 402, for example), based on a first input (such as x or y, for example) representative of one of a beginning point or an ending point of a time interval and a second input (such as the other of x or y, for example) representative of the other of the beginning point or the ending point of the time interval.

At block 1404, the process includes generating a stop signal using a logical AND function (such as with an AND gate 404, for example), based on the first input and the second input.

At block 1406, the process includes generating a duration value at a time-to-digital converter (TDC) (such as TDC 102, for example) based on the start signal and the stop signal.

At block 1408, the process includes determining a polarity of the time interval (such as with an auxiliary TDC 406, for example).

At block 1410, the process includes generating a digital value representative of the time interval (such as with a BTDC 400 or 1000, for example), based on the duration value and the polarity of the time interval, where the time interval comprises a positive time interval or a negative time interval.

In one implementation, the process includes generating a delay offset value by substituting one or more calibration signals for the start signal and the stop signal at the TDC. In the implementation, the process includes modifying the start signal and/or the duration value to compensate for the delay offset value generated.

In another implementation, the process includes substituting one or more calibration signals for the start signal and the stop signal at the TDC, where the one or more calibration signals have predetermined phase and/or frequency characteristics. The process additionally includes processing at least the output of the TDC to determine a delay offset value of the TDC, using a calibration algorithm. In alternate implementations, other signals may also be processed by the calibration algorithm as desired.

In the implementation, the process further includes adjusting a correction component using the calibration algorithm, based on the delay offset value determined during the processing and modifying the start signal and/or the duration value using the correction component to compensate for the delay offset value.

In a further implementation, the process includes generating the duration value at a second TDC (such as with an auxiliary TDC 406, for example) for a preselected range of time intervals, based on the first input and the second input. In an example, the TDC and the second TDC may be arranged to generate duration values for the time interval, based on a length of the time interval. For instance, the TDC may generate duration values for larger time intervals and the second TDC may generate duration values for smaller time intervals (such as those very close to zero, e.g., a few nanoseconds, for example). In some examples, the duration values generated by the TDC and the second TDC overlap.

In one implementation, the process includes generating the duration value at the TDC based on a multiplicity of input values, wherein a measurement of the duration value begins when a first input value of the multiplicity of input values becomes active and the measurement of the duration value ends when all input values of the multiplicity of input values are active.

In alternate implementations, other techniques may be included in the process 1400 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. An apparatus, comprising:
   a linear time-to-digital converter (TDC) arranged to output a duration value based on receiving a start signal and a stop signal, the apparatus arranged to output a digital value representative of a duration of a time interval and a polarity of the time interval, based on the duration value, the time interval comprising a positive time interval or a negative time interval; and
   an input component arranged to output the start signal and the stop signal based on receiving a first input and a second input, the first input representative of one of a beginning point or an ending point of the time interval and the second input representative of the other of the beginning point or the ending point of the time interval.

2. The apparatus of claim 1, further comprising an auxiliary TDC coupled to the input component and arranged to determine the polarity of the time interval.

3. The apparatus of claim 2, wherein the auxiliary TDC is further coupled to the start signal and is arranged to detect whether the first input or the second input is representative of the beginning point of the time interval.

4. The apparatus of claim 2, wherein the auxiliary TDC is arranged to output the duration value for a preselected range of time intervals.

5. The apparatus of claim 2, further comprising a post-processing component arranged to receive the duration value and the polarity of the time interval and to output the digital value.

6. The apparatus of claim 5, wherein the post-processing component adds calibration information to the digital value based on an overlap of duration value outputs from the TDC and the auxiliary TDC.

7. The apparatus of claim 1, including an adjustable correction component arranged to modify the start signal and/or the duration value, based on a delay offset of the TDC, the delay offset determined by processing one or more calibration signals through the TDC.

8. The apparatus of claim 7, further comprising a calibration algorithm arranged to tune the adjustable correction component based on the delay offset determined by processing the one or more calibration signals through the TDC.

9. The apparatus of claim 7, further comprising two or more multiplexers arranged to multiplex the start signal and the stop signal with the one or more calibration signals, outputs of the two or more multiplexers comprising start and stop inputs to the TDC.

10. The apparatus of claim 9, wherein the two or more multiplexers are arranged to output the start signal and the stop signal while in an operational mode and are arranged to output the one or more calibration signals while in a calibration mode.

11. The apparatus of claim 7, wherein the input component comprises a symmetric OR gate arranged to output the start signal based on receiving the first input and the second input, and a symmetric AND gate arranged to output the stop signal based on receiving the first input and the second input.

12. The apparatus of claim 7, wherein the adjustable correction component is applied to an analog portion of the apparatus, and is arranged to adjust the start signal to compensate for the delay offset of the TDC.

13. The apparatus of claim 7, wherein the adjustable correction component is applied to a digital portion of the apparatus, and is arranged to adjust the duration value to compensate for the delay offset of the TDC.

14. A method operating a bipolar time-to-digital converter (TDC):
   receiving a first input and a second input at an input component, the first input representative of one of a beginning point or an ending point of the time interval and the second input representative of the other of the beginning point or the ending point of the time interval;
   outputting a start signal and a stop signal from the input component, the start signal and the stop signal based on the first input and the second input;
   receiving the start signal and the stop signal at a linear TDC;
   providing a digital value from an output of the linear TDC at an output of the bipolar TDC, the digital value the representative of a duration of a time interval and a polarity of the time interval, based on the duration, the time interval comprising a positive time interval or a negative time interval.

15. The method of claim 14, including determining the polarity of the time interval using an auxiliary TDC coupled to the input component.

16. The method of claim 15, wherein the determining the polarity of the time interval includes determining if the first signal or the second signal is a beginning point of the time interval using the auxiliary TDC.

17. The method of claim 14, further comprising:
   generating a delay offset value by substituting one or more calibration signals for the start signal and the stop signal at the TDC; and
   modifying the start signal and/or the duration value to compensate for the delay offset value.

18. The method of claim 14, further comprising:
   substituting one or more calibration signals for the start signal and the stop signal at the TDC, the one or more calibration signals having predetermined phase and/or frequency characteristics;
   processing at least the output of the TDC to determine delay offset value of the TDC, using a calibration algorithm;
   adjusting a correction component using the calibration algorithm, based on the delay offset value determined during the processing; and
   modifying the start signal and/or the duration value using the correction component to compensate for the delay offset value.

19. The method of claim 14, further comprising generating the duration value at a second TDC for a preselected range of time intervals, based on the first input and the second input.

20. The method of claim 14, further comprising generating the duration value at the TDC based on a multiplicity of input values, wherein a measurement of the duration value begins when a first input value of the multiplicity of input values becomes active and the measurement of the duration value ends when all input values of the multiplicity of input values are active.

* * * * *